US006573186B2

(12) United States Patent
Park

(10) Patent No.: US 6,573,186 B2
(45) Date of Patent: Jun. 3, 2003

(54) METHOD FOR FORMING PLUG OF SEMICONDUCTOR DEVICE

(75) Inventor: Nae Hak Park, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 52 days.

(21) Appl. No.: 09/845,174

(22) Filed: May 1, 2001

(65) Prior Publication Data

US 2002/0034848 A1 Mar. 21, 2002

(30) Foreign Application Priority Data

Sep. 21, 2000 (KR) ........................................ 2000-55498

(51) Int. Cl.[7] ..................... H01L 21/302; H01L 21/8234
(52) U.S. Cl. ........................ 438/691; 693/438; 693/238
(58) Field of Search .......................... 438/299, 229, 438/183, 273, 279, 276, 587, 591, 691, 692, 697, 693, 694, 700, 238; 257/300, 513, 520

(56) References Cited

U.S. PATENT DOCUMENTS

| | | | | |
|---|---|---|---|---|
| 5,665,202 A | * | 9/1997 | Subramanian et al. | 216/11 |
| 5,697,992 A | * | 12/1997 | Ueda et al. | 51/307 |
| 5,895,961 A | | 4/1999 | Chen | |
| 5,946,548 A | * | 8/1999 | Hashimoto et al. | 438/187 |
| 6,114,248 A | * | 9/2000 | Gambino et al. | 438/692 |
| 6,162,368 A | * | 12/2000 | Li et al. | 216/38 |
| 6,335,285 B1 | * | 1/2002 | Chun et al. | 438/692 |
| 6,348,415 B1 | * | 2/2002 | Lee et al. | 438/622 |
| 6,387,759 B1 | * | 5/2002 | Park et al. | 438/275 |

* cited by examiner

Primary Examiner—Olik Chaudhuri
Assistant Examiner—Brook Kebede
(74) Attorney, Agent, or Firm—Birch, Stewart, Kolasch & Birch, LLP

(57) ABSTRACT

The method of forming a plug of a semiconductor device includes sequentially forming a conductive film and an insulation film over a semiconductor substrate having a high density region and a low density region. The high density region has a greater number of structures formed thereover than the low density region. Next, a first CMP (chemical mechanical polishing) process, in which slurry for removing insulating film is used, is performed to selectively remove the insulating film and expose a top surface of the conductive film. Then a second CMP process, in which slurry for removing conductive film is used, is performed to selectively remove the conductive film and the insulating film and expose structures in the high density region.

15 Claims, 6 Drawing Sheets

METHOD FOR FORMING PLUG OF SEMICONDUCTOR DEVICE

BACKGROUND OF THE INVENTION

1. Field of the Invention

The present invention relates to a process for fabricating a semiconductor device, and more particularly, to a method for forming a plug of a semiconductor device that improves characteristic of the semiconductor device and its structure.

2. Background of the Related Art

Generally, a poly plug is formed using polysilicon in a DRAM and a logic device. Recently, with the reduction of the design rule, a chemical mechanical polishing (CMP) process is used to form a poly plug, instead of an etch back process.

Two methods for forming a poly plug using CMP process have been suggested.

One method is to form a poly plug using the CMP process after contact etching.

The other is a method for forming a line poly plug by depositing polysilicon and then etching it by the CMP process. In this method, the CMP process may be performed to form a line poly plug directly after a later process is performed on a wordline pattern and polysilicon is deposited thereon. In this case, a height difference of a plug may occur due to a density difference of a lower structure (gate pattern). To minimize such height difference, after forming polysilicon, polysilicon in a portion where lower pattern density is high may partially be removed by an etching process and then a plug is formed by the CMP process.

The first related art method for forming a plug of a semiconductor device will be described with reference to the accompanying drawings. In this method, a poly plug is formed within a contact hole using the CMP process.

FIGS. 1a to 1f are sectional views showing the first related art method for forming a plug of a semiconductor device.

As shown in FIG. 1a, a first polysilicon film 11 and a cap insulating film 12 for a wordline are sequentially formed on a semiconductor substrate 10 in which a cell region and a peripheral region are defined.

The first polysilicon film 11 and the cap insulating film 12 are selectively removed to densely form the wordline in the cell region and sparsely form the wordline in the peripheral region.

An insulating film 13 is formed on an entire surface of the semiconductor substrate 10 including the cap insulating film 12. A first photoresist (not shown) is then deposited on the insulating film 13 and patterned to expose the cell region only.

Insulating film spacers 13a are formed at both sides of the cap insulating film 12 and the first polysilicon film 11 by performing etch-back process in the exposed cell region, and the first photoresist is removed.

As shown in FIGS. 1b and 1c, an inter layer dielectric (ILD) film 14 is formed on the entire surface of the semiconductor substrate 10 and then planarized by the CMP process.

As shown in FIG. 1d, a second photoresist (not shown) is deposited on the entire surface and then patterned by exposure and developing processes to define a contact region.

The ILD film 14 is selectively removed using the patterned photoresist as a mask to partially expose the surface of the semiconductor substrate 10. Thus, a contact hole 15 is formed and the second photoresist is removed.

As shown in FIGS. 1e and 1f, a second polysilicon film 16 is formed on the entire surface including the contact hole 15, and the CMP process is performed using the ILD film 14 as an end point to form a poly plug 16a within the contact hole 15. The poly plug 16a electrically connects an upper structure with the semiconductor substrate.

The second method for forming a poly plug by an etching process after forming a polysilicon line of a damascene structure will now be described.

FIGS. 2a to 2c are sectional views showing the second related art method for forming a plug of a semiconductor device.

As shown in FIG. 2a, a first polysilicon film 21 and a cap insulating film 22 for a wordline are sequentially formed on a semiconductor substrate 20 in which a cell region and a peripheral region are defined.

The first polysilicon film 21 and the cap insulating film 22 are selectively removed to densely form the wordline in the cell region and sparsely form the wordline in the peripheral region.

An insulating film 23 is formed on an entire surface of the semiconductor substrate 20. A photoresist (not shown) is then deposited on the insulating film 23 and patterned to expose the cell region only.

Insulating film spacers 23a are formed at both sides of the cap insulating film 22 and the first polysilicon film 21 by performing etch-back process in the exposed cell region, and the photoresist is removed.

As shown in FIGS. 2b and 2c, a second polysilicon film 24 is formed on the entire surface of the semiconductor substrate 20, and the CMP process is performed using the cap insulating film 22 as an end point to form a poly plug 24a in a space between the insulating film spacers 23a of the cell region and around the wordline of the peripheral region.

At this time, it is difficult for the end point to be detected during the CMP process due to density difference of the wordline pattern in the cell region and the peripheral region. For this reason, the first polysilicon film 21 and the poly plug 24a in the peripheral region are damaged, thereby generating a step difference between the poly plug 24a of the cell region and the poly plug 24a of the peripheral region.

To solve the above problem according to the second related art method for forming a plug of a semiconductor device, the third related art method for forming a plug of a semiconductor device will be described with reference to FIGS. 3a to 3d.

FIGS. 3a to 3d are sectional views showing the third related art method for forming a plug of a semiconductor device.

As shown in FIG. 3a, a first polysilicon film 31 and a cap insulating film 32 for a wordline are sequentially formed on a semiconductor substrate 30 in which a cell region and a peripheral region are defined.

The first polysilicon film 31 and the cap insulating film 32 are selectively removed to densely form the wordline in the cell region and sparsely form the wordline in the peripheral region.

An insulating film 33 is formed on an entire surface of the semiconductor substrate 30 in which the wordline is formed. A photoresist (not shown) is then deposited on the insulating film 33 and patterned to expose the cell region only.

Insulating film spacers 33a are formed at both sides of the cap insulating film 32 and the first polysilicon film 31 by performing etch-back process in the exposed cell region, and the photoresist is removed.

As shown in FIGS. 3b and 3c, a second polysilicon film 34 is formed on the entire surface of the semiconductor substrate 30. A photoresist (not shown) is then deposited on the entire surface and patterned by exposure and developing processes.

The second polysilicon film 34 on the wordline densely formed in the cell region is removed using the patterned photoresist as a mask, and the photoresist is removed.

As shown in FIG. 3d, the CMP process is performed using the cap insulating film 32 as an end point to form a poly plug 34a in a space around both the insulating film spacers 33a of the cell region and the wordline of the peripheral region.

However, the aforementioned related art methods for forming a plug of a semiconductor device have several problems.

First, the CMP process of polysilicon causes a height difference of the poly plug due to pattern density of the lower structure (wordline pattern).

The third related art method to solve the first problem has a problem in ensuring a process margin according to the formation of polysilicon and the etch-back process. The third related art method also has a problem in detecting the end point essentially required in the CMP process.

Furthermore, in the third related art method, a photolithography process is additionally performed to minimize the height difference of the poly plug. Thus, the process becomes more complicated and costly.

SUMMARY OF THE INVENTION

Accordingly, the present invention is directed to a method for forming a plug of a semiconductor device that substantially obviates one or more of the problems due to limitations and disadvantages of the related art.

An object of the present invention is to provide a method for forming a plug of a semiconductor device in which a height difference due to a density difference of a lower structure is reduced when forming a plug by CMP, so as to improve characteristic of the device and its structure.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve these and other advantages and in accordance with the purpose of the present invention, as embodied and broadly described, a method for forming a plug of a semiconductor device according to the present invention includes the steps of: forming a plurality of wordlines over a semiconductor substrate in which a cell region and a peripheral region are defined; forming a cap insulating film on the respective wordlines; forming a first insulating film over the semiconductor substrate including the cap insulating film; forming first insulating film spacers at both sides of the wordlines formed in the cell region; sequentially forming a conductive film and a second insulating film over the semiconductor substrate; selectively removing the second insulating film to expose a top surface of the conductive film; and selectively removing the conductive film and the second insulating film to expose a surface of the cap insulating film in the cell region.

These and other advantages are also achieved by providing a method of forming a plug of a semiconductor device, comprising sequentially forming a conductive film and an insulation film over a semiconductor substrate having a high density region and a low density region, the high density region have a greater number of structures formed thereover than the low density region; performing a first CMP (chemical mechanical polishing) process, in which slurry for removing insulating film is used, to selectively remove the insulating film and expose a top surface of the conductive film; and performing a second CMP process, in which slurry for removing conductive film is used, to selectively remove the conductive film and the insulating film and expose structures in the high density region.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

In the present invention, to minimize a step difference of a poly plug formed in a cell region and a peripheral region according to pattern density of a lower structure, a polysilicon film is formed to be higher than a cap insulating film on a wordline and then an insulating film is formed on the polysilicon film.

The CMP process is primarily performed to remove the insulating film on the polysilicon film on the wordline in the cell region and the peripheral region. At this time, the insulating film on the polysilicon film around the wordline in the peripheral region remains without being removed.

The CMP process is secondarily performed using the cap insulating film on the wordline as an end point to planarize the polysilicon film.

At this time, the insulating film on the polysilicon film, which remains without being removed during the first CMP process, still remains without being removed because the polysilicon film has an etch selectivity different from the insulating film.

A method for forming a plug of a semiconductor device will be described in detail with reference to the accompanying drawings.

FIGS. 4a to 4e are sectional views showing a method for forming a plug of a semiconductor device according to the present invention.

Figure 1A:
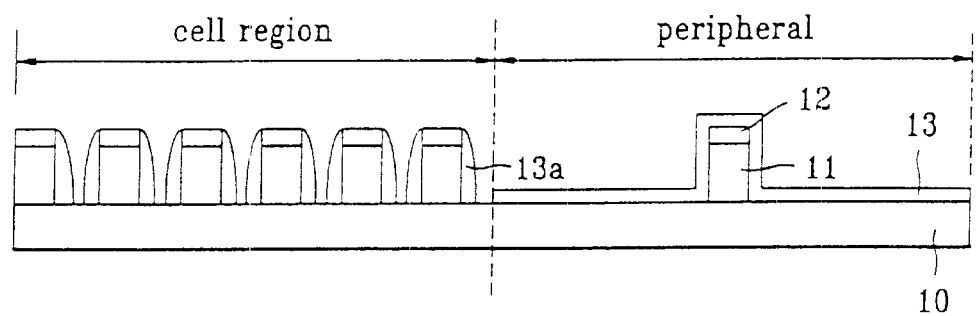
FIGS. 1a to 1f are sectional views showing a first related art method for forming a plug of a semiconductor device.
Figure 1B:
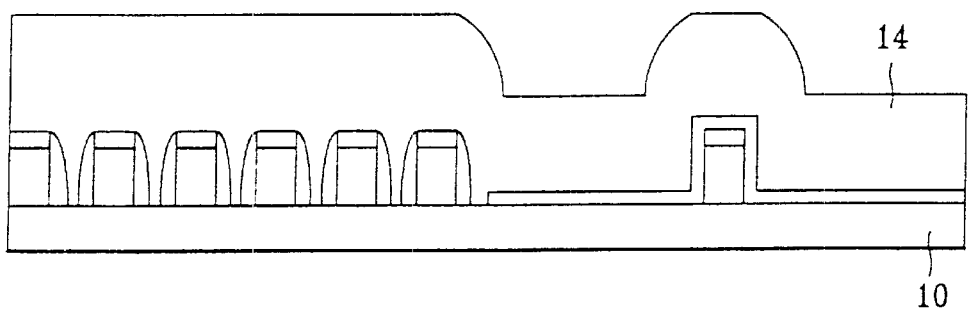
Figure 1C:
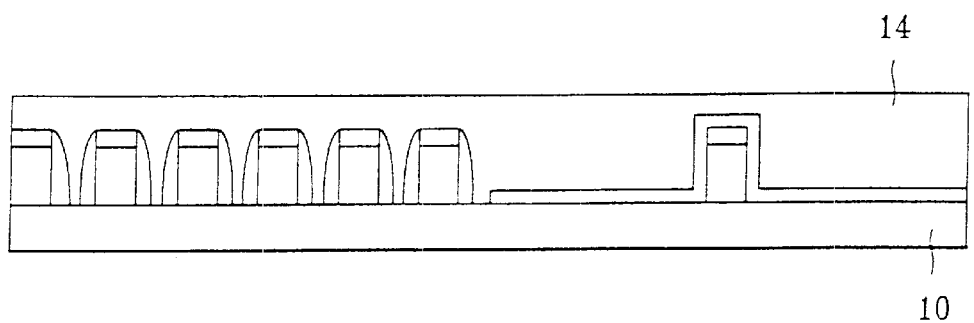
Figure 1D:
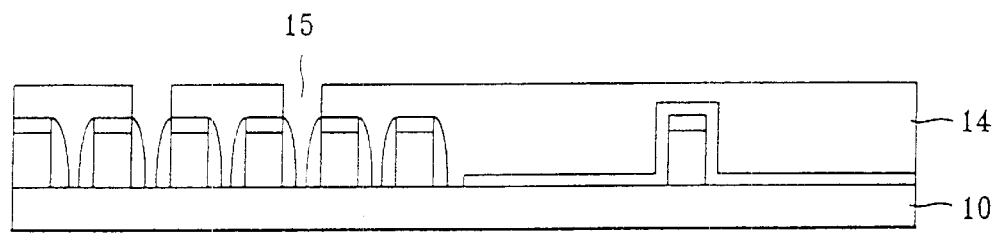
Figure 1E:
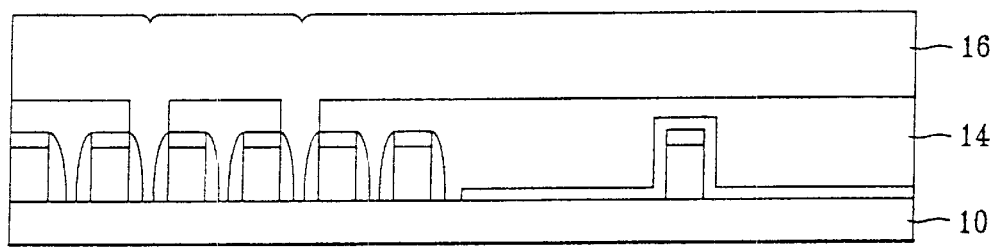
Figure 1F:
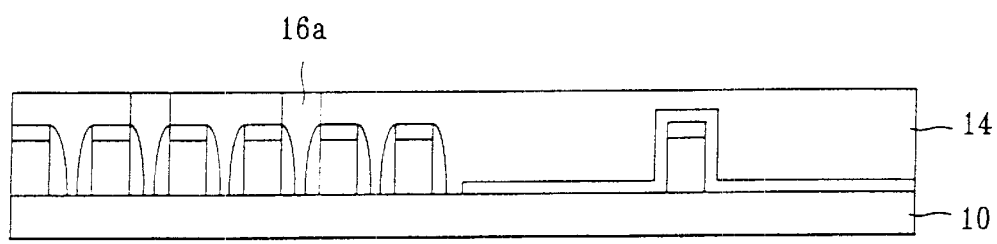
Figure 2A:
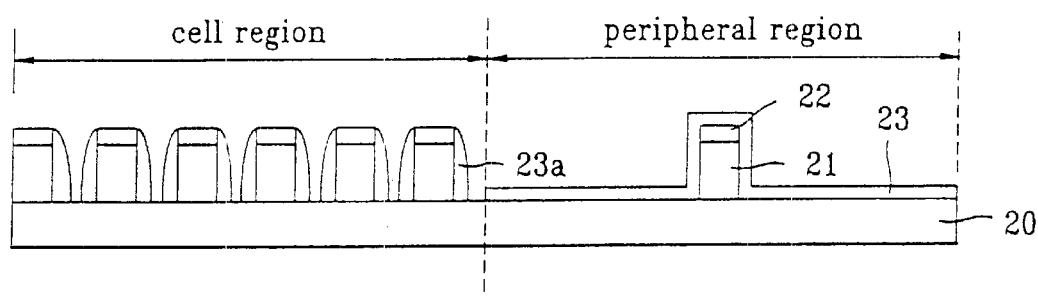
FIGS. 2a to 2c are sectional views showing a second related art method for forming a plug of a semiconductor device.
Figure 2B:
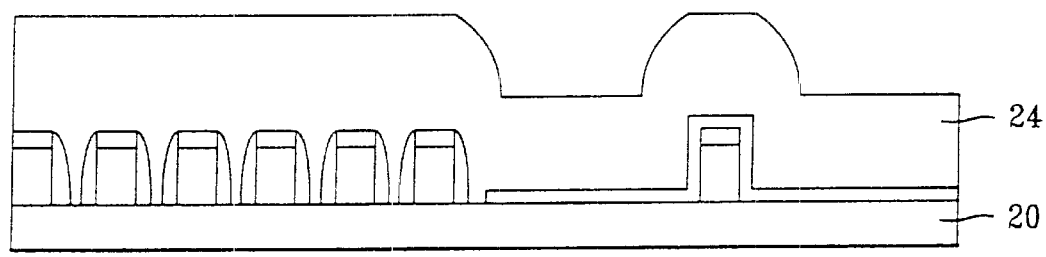
Figure 2C:
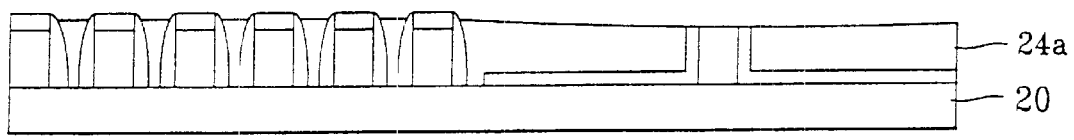
Figure 3A:
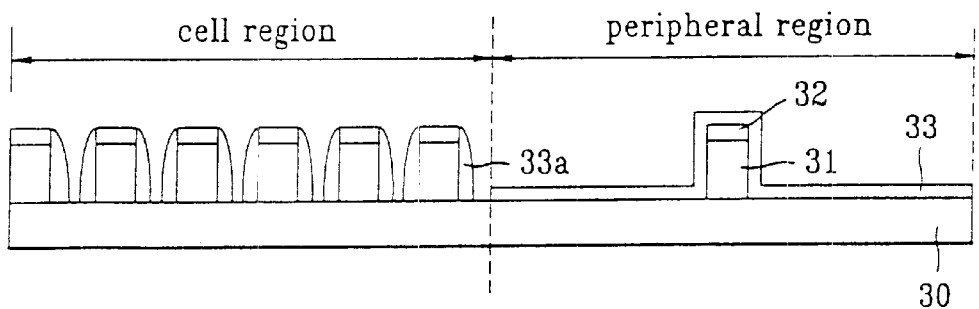
FIGS. 3a to 3d are sectional views showing a third related art method for forming a plug of a semiconductor device.
Figure 3B:
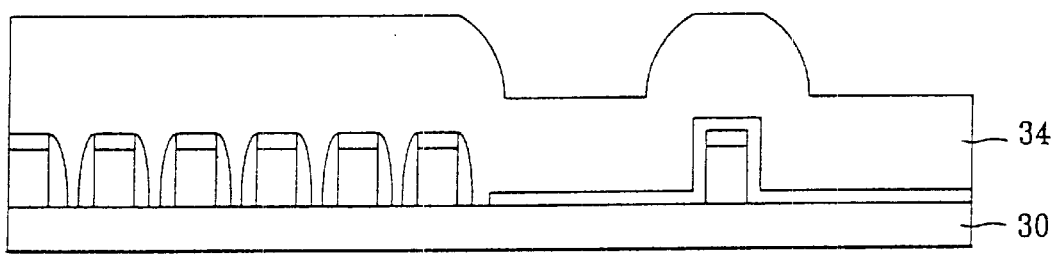
Figure 3C:
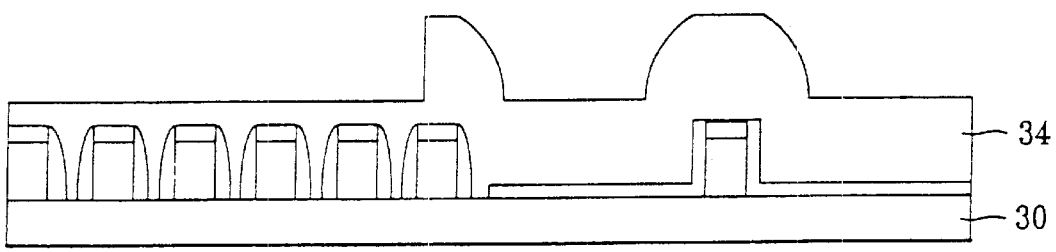
Figure 3D:
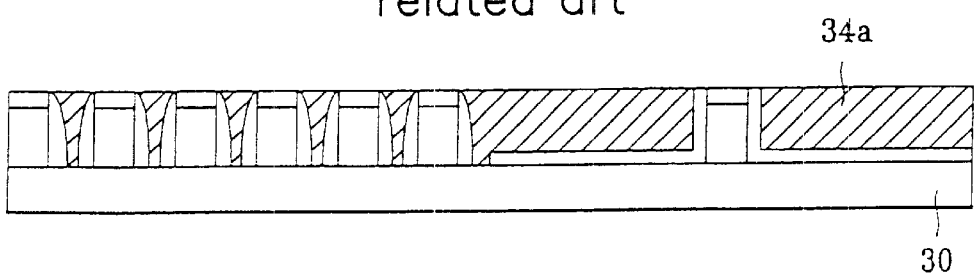
Figure 4A:
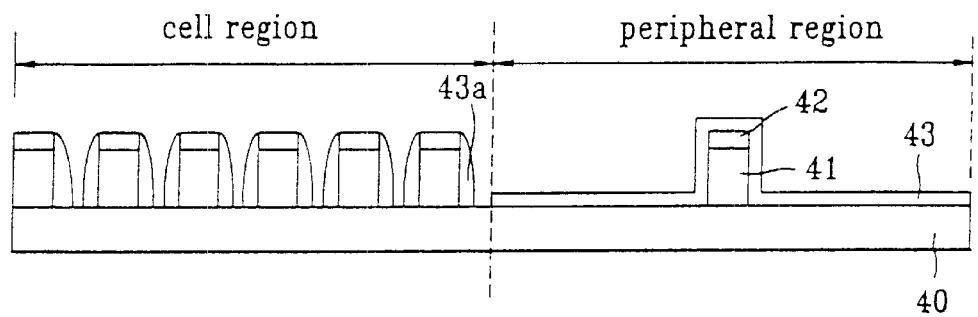
FIGS. 4a to 4e are sectional views showing a method for forming a plug of a semiconductor device according to an embodiment of the present invention.

As shown in FIG. 4a, a first polysilicon film 41 and a cap insulating film 42 for wordlines are sequentially formed on a semiconductor substrate 40 in which a cell region and a peripheral region are defined.

A photoresist (not shown) is deposited on the cap insulating film 42 and then patterned by exposure and developing processes. The first polysilicon film 41 and the cap insulating film 42 are selectively removed using the patterned photoresist as a mask to densely form the wordlines at constant intervals in the cell region and sparsely form the wordlines in the peripheral region.

The photoresist is then removed, and a first insulating film 43 is formed on an entire surface of the semiconductor substrate 40. A photoresist (not shown) is deposited on the first insulating film 43 and patterned to expose the cell region only.

Insulating film spacers 43a are formed at both sides of the cap insulating film 42 and the first polysilicon film 41 by performing an etch-back process in the exposed cell region, and the photoresist is removed.

Figure 4B:
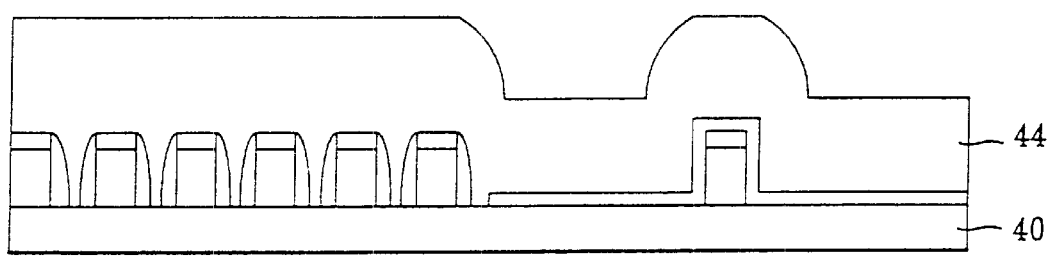
Figure 4C:
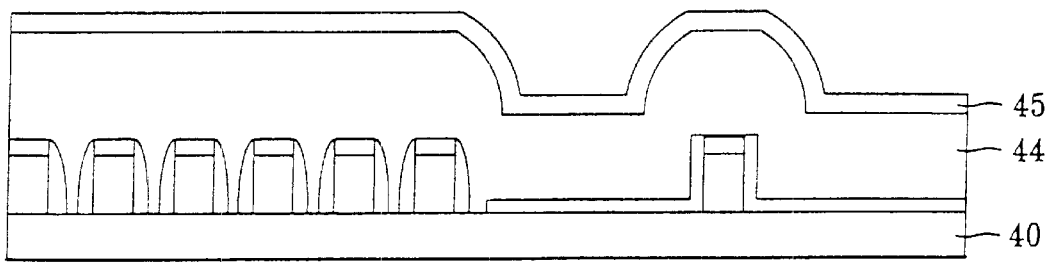

As shown in FIGS. 4b and 4c, a second polysilicon film 44 and a second insulating film 45 for formation of a plug are sequentially formed on the entire surface of the semiconductor substrate 40.

Any one of an oxide film, such as plasma enhanced-tetra ethyl ortho silicate (PE-RTEOS), tetra ethyl ortho silicate ($O_3$-TEOS), plasma enhanced(PE)-$SiH_4$, and SiON, and a nitride film such as SiN and BN may be used as the second insulating film 45. The second insulating film 45 has a thickness of 10–2000 Å, preferably, 300 Å.

Figure 4D:
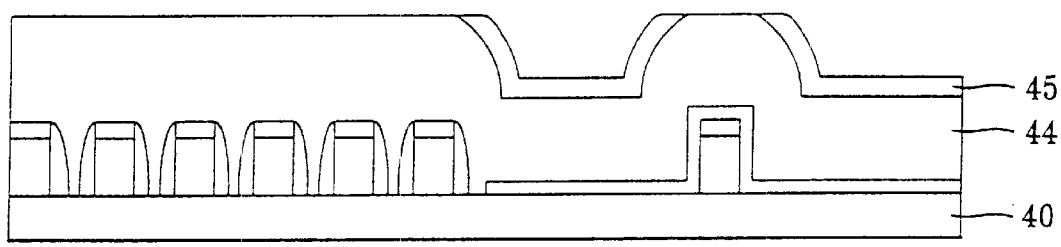

As shown in FIG. 4d, a first CMP process is performed using slurry for removing insulating film, and the second polysilicon film 44 on the wordlines is used as an end point. At this time, the second insulating film 45 on the second polysilicon film 44 on the wordlines is only removed while the second insulating film 45 on the other portions remains without being removed.

Figure 4E:
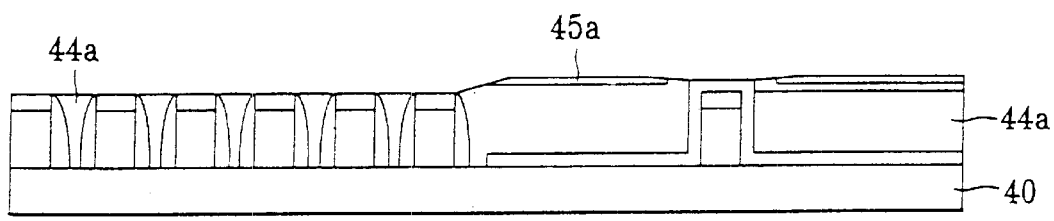

As shown in FIG. 4e, a second CMP process is performed using slurry for removing polysilicon to planarize the second polysilicon film 44.

When the second CMP process is performed, the second polysilicon film 44 is polished using the cap insulating film 45 on the first polysilicon film 41 as an end point, so that a poly plug 44a electrically connected with an upper structure is formed in a space between the insulating film spacers 43 of the cell region and around the wordlines of the peripheral region.

Meanwhile, when the second polysilicon film 44 of the cell region is polished during the second CMP process, the second polysilicon film 44 and the second insulating film 45 respectively have different etch selectivity. Accordingly, the second insulating film 45 on the second polysilicon film 44 in the peripheral region is not polished and remains without being removed.

Thus, the second insulating film 45 which remains on the second polysilicon film 44 without being removed proceeds to a later process.

Generally, the slurry used when the CMP process is performed means a medium which communicates polishing particles and chemical materials from or to a surface of a semiconductor substrate.

In the CMP process in which slurry for removing the insulating film is used, alkali is added to a fumed silica. At this time, to stabilize the pH, a buffer solution may be added or an additive for improving cleaning may be added.

The fumed silica, which is a general polisher of the CMP process, has high purity at a relative low cost and its polishing articles are not precipitated unlike other polishers. In this respect, the fumed silica is used in the CMP process of an interleaving insulating film.

The fumed silica is called a vapor silica, and is obtained by burning tetrachloride silicon from oxygen hydrogen. A process for fabricating the fumed silica includes the steps of supplying raw materials such as tetrachloride silicon, hydrogen, and air to a reaction burner and generating a silica by high temperature reaction at 1000° C. or above.

The generated silica is collected by a back filter, and as a byproduct, hydrogen chloride is generated. The silica is separated from the hydrogen chloride. To obtain primary particles having different particle sizes for an effective polishing material, a high temperature is required.

A slurry of high dispersion can be obtained by dispersing the silica in an ultrapure state and adding alkali, which is a stabilizer (processing accelerant).

The slurry for removing the polysilicon includes the fumed silica. Generally, the slurry is obtained by adding alkali aqueous solution to colloidal silica.

The colloidal silica can be obtained at high purity of grade equivalent to a CVD oxide film in a process for fabricating a semiconductor, by wet-hydrolyzing an organic silicide. This is to fabricate the organic silicide of a raw material by distillation.

The process for fabricating the colloidal silica will now be described in detail.

First, organic silicide is contained in a solvent to be introduced into a reaction tub. Hydrolysis is then started. Various particles of colloidal silica having diameters of about 10 nm~200 nm can be obtained by controlling a reaction temperature and reaction concentration. At this time, since a large quantity of alcohols are contained in the solvent, the alcohols are removed by distillation in a later process and the solvent is concentrated. Thus, the colloidal silica of high purity is obtained. Subsequently, an additive such as a processing accelerant required for the next process is added and accurately filtered, thereby fabricating the product. The purity of the silica obtained as above reaches 99.999%, and its ionization is stable in a neutral region due to small impurities. Also, it is not necessary to add alkali as a stabilizer.

A method for forming a plug of a semiconductor device according to another embodiment of the present invention will be described below. No illustration thereof is necessary because the methods steps are readily understood by reference to FIGS. 4a–4e.

If the present invention is applied to a process for forming a plug within a contact hole after forming the contact hole, a polysilicon film and a cap insulating film for wordlines are sequentially formed on a semiconductor substrate in which a cell region and a peripheral region are defined. The cap insulating film and the polysilicon are selectively removed to densely form the wordlines at constant intervals in the cell region and sparsely form the wordlines in the peripheral region.

Subsequently, insulating film spacers are formed at both sides of the wordlines in the cell region, and an ILD film is formed on an entire surface of the semiconductor substrate. The ILD film is then planarized by the CMP process. A photoresist is deposited on the ILD film and patterned by exposure and developing processes to define a contact region.

The ILD film is selectively removed using the patterned photoresist as a mask to partially expose the semiconductor substrate, so that a contact hole is formed.

The photoresist is removed, and a polysilicon film is formed on the entire surface including the contact hole. An insulating film is formed on the polysilicon film.

The same process steps as shown in FIGS. 4d and 4e are performed on the insulating film, so that a poly plug which electrically connects with an upper structure is formed within the contact hole.

As aforementioned, the method for forming a plug of a semiconductor substrate according to the present invention has the following advantages.

First, it is possible to remove the step difference between the height of the poly plug in the peripheral region having a lower pattern (wordline pattern) of low density and the height of the poly plug formed in the cell region having a lower pattern of high density.

Second, since the CMP process can effectively be stopped at the height of the poly plug set as a target using the insulating film on the second polysilicon as a CMP stop layer, stable process steps can be obtained.

Third, since a site is not almost changed after the CMP process in view of accuracy of an align key in a later photolithography process, a process for using a mask for the align key can be omitted.

Finally, since cell open and align key open mask process steps can be omitted, the process steps can be simplified. This saves the production cost.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications and variations will be apparent to those skilled in the art. In the claims, means-plus-function clauses are intended to cover the structures described herein as performing the recited function and not only structural equivalents but also equivalent structures.

What is claimed is:

1. A method for forming a plug of a semiconductor device comprising the steps of:
    forming a plurality of wordlines over a semiconductor substrate in which a cell region and a peripheral region are defined;
    forming a cap insulating film on the respective wordlines;
    forming a first insulating film over the semiconductor substrate including the cap insulating film;
    forming first insulating film spacers at both sides of the wordlines formed in the cell region;
    sequentially forming a conductive film and a second insulating film over the semiconductor substrate;
    selectively removing the second insulating film to expose a top surface of the conductive film; and
    selectively removing portions of the conductive film and the second insulating film to expose a surface of the cap insulating film in the cell region, wherein a thin layer of the second insulating film remains on a portion of the conductive film that is not removed.

2. The method of claim 1, wherein the second insulating film is either an oxide film or a nitride film.

3. The method of claim 1, wherein the second insulating film has a thickness of 10~2000 Å.

4. The method of claim 1, wherein the second insulating film and the conductive film are removed by a CMP (chemical mechanical polishing) process.

5. The method of claim 1, wherein the conductive film is formed of polysilicon.

6. The method of claim 2, wherein the oxide film is formed of one of PETEOS, $O_3$-TEOS, $PESiH_4$, and SiON.

7. The method of claim 2, wherein the nitride film is formed of either SiN or BN.

8. The method of claim 4, wherein the second insulating film is removed by a first CMP process in which slurry for removing insulating film is used, the slurry including fumed silica to which alkali is added.

9. The method of claim 4, wherein the conductive film is removed by a CMP process in which slurry for removing polysilicon is used, the slurry including colloidal silica to which alkali aqueous solution is added.

10. The method of claim 8, wherein the conductive film is removed by a second CMP process in which slurry for removing polysilicon is used, the slurry including colloidal silica to which alkali aqueous solution is added.

11. The method of claim 1, wherein the selectively removing the second insluting film step includes a CMP (chemical mechanical polishing) process in which slurry for removing insulation film is used.

12. The method of claim 1, wherein the selectively removing the conductive film step includes a CMP (chemical mechanical polishing) process in which slurry for removing conductive film is used.

13. The method of claim 11, wherein the selectively removing the conductive film step includes a CMP (chemical mechanical polishing) process in which slurry for removing conductive film is used.

14. A method of forming a plug of a semiconductor device, comprising:
    sequentially forming a conductive film and an insulation film over a semiconductor substrate having a high density region and a low density region, the high density region having a greater number of structures formed thereover than the low density region;
    performing a first CMP (chemical mechanical polishing) process, in which a slurry for removing insulating film is used, to selectively remove the insulating film and expose a top surface of the conductive film; and
    performing a second CMP process, in which a slurry for removing the conductive film is used, to selectively remove portions of the conductive film and the insulating film to expose structures in the high density region, wherein a thin layer of the insulating film remains on a portion of the conductive film that is not removed.

15. The method of claim 14, wherein at least one portion of the semiconductor substrate is exposed in the high density region such that the conductive film contacts said portion of the semiconductor substrate.

* * * * *